United States Patent

Schnabel et al.

[11] Patent Number: 6,165,896
[45] Date of Patent: Dec. 26, 2000

[54] SELF-ALIGNED FORMATION AND METHOD FOR SEMICONDUCTORS

[75] Inventors: Rainer F. Schnabel, Wappingers Falls, N.Y.; Jeffrey Gambino, Gaylordsville, Conn.; Zhijian Lu, Poughkeepsie, N.Y.

[73] Assignee: Siemens Aktiengesellschaft, Munich, Germany

[21] Appl. No.: 09/105,226

[22] Filed: Jun. 25, 1998

[51] Int. Cl.⁷ .............................................. H01L 21/4763
[52] U.S. Cl. ...................... 438/636; 438/514; 438/526; 438/586; 438/593; 438/595
[58] Field of Search ................... 438/475, 514, 438/526, 586, 593, 595, 636

[56] References Cited

U.S. PATENT DOCUMENTS

| | | | |
|---|---|---|---|
| 5,091,326 | 2/1992 | Haskell | 438/593 |
| 5,904,529 | 5/1999 | Gardner et al. | 438/286 |
| 5,937,302 | 8/1999 | Gardner et al. | 438/305 |
| 5,946,585 | 8/1999 | Zhang et al. | 438/475 |

*Primary Examiner*—David Nelms
*Assistant Examiner*—Renee R. Berry
*Attorney, Agent, or Firm*—Donald B. Paschburg

[57] ABSTRACT

A method for forming self-aligned features for semiconductor devices includes the steps of providing a first layer including a reflective material on a surface of the first layer, a second layer formed on the first layer, and a resist layer formed on the second layer, providing radiation through the resist layer and the second layer wherein the radiation is reflected from the reflective material back to the resist layer thereby increasing irradiation of the resist layer over the reflective material and developing the resist layer. A semiconductor device in accordance with the invention includes a first layer with reflective structures therein. A second layer is formed on the first layer, and a patterned resist layer is formed on the second layer. Etched holes are formed in the second layer in accordance with the resist layer pattern, and interconnects are formed in the holes for electrically coupling to the reflective structures wherein the patterned resist layer is rendered by light transmitted through the resist layer and the second layer and reflected from the reflective structures thereby adequately exposing areas directly over the reflective structures, the exposed areas defining the interconnect locations such that the interconnects are aligned with the reflective structures when formed in the holes.

27 Claims, 4 Drawing Sheets ical Field

This disclosure relates to semiconductor devices and more particularly, to a self-aligned interconnect and method for forming the self-aligned interconnect.

2. Description of the Related Art

Semiconductor devices typically include several metal layers which includes metal lines. It is often required to connect metal lines between such layers. This is performed using vertical interconnects or vias between the metal layers. The following is a description of a typical process sequence used to fabricate vias on top of a conductor.

A conductive or metal layer is patterned and formed into metal lines, for instance, by lithographically masking areas to be protected from an etchant material. A dielectric layer is formed on the metal layer. Locations for vias are lithographically defined. For example, a resist layer is deposited and patterned by a photolithographic image. Depending on the resist used and the processes to be performed a negative resist mask or a positive resist mask may be used. The mask and resist are exposed to electromagnetic radiation, usually light, which develops the resist layer to allow etching of portions of the mask while other portions remain. The remaining portions protect the underlying surface partly such that etching a pattern into the dielectric layer may be performed. Vias may be formed in the etched areas to connect one metal layer to a different metal layer.

Reflections of the incident radiation from the embedded structures on the resist are usually considered undesirable due to the inhomogeneity across the surface of a given chip. The conventional approach is therefore to eliminate such reflections by providing anti-reflective coatings on the underlying surfaces.

In addition, the lithographic mask and the metal lines of the metal layer must be aligned so that when the etched areas in the dielectric for via formation are created, they coincide with metal lines in the metal layer below the dielectric layer. This is often difficult in particular with critical feature sizes below 0.5 microns.

To account for alignment variations (slight misalignments), a "landing pad" or metal line under the via is typically formed having a larger thickness. The larger thickness is usually larger than the via and is preferably the via diameter plus the worst case misalignment tolerated by a process specification for the device. The large landing pad consumes layout area for a chip design and therefore contributes to the factors that increase chip size.

Therefore, a need exists for a self-aligned interconnect and method for forming the self-aligned interconnect for providing reduced layout area during fabrication of semiconductor chips. A further need exists for a method of exposing resist by exploiting radiation reflections from layers having a greater reflectance.

SUMMARY OF THE INVENTION

In accordance with the present invention, a method for forming self-aligned features for semiconductor devices includes the steps of providing a first layer including a reflective material on a surface of the first layer, a second layer formed on the first layer, and a resist layer formed on the second layer, providing radiation through the resist layer and the second layer wherein the radiation is reflected from the reflective material back to the resist layer thereby increasing irradiation of the resist layer over the reflective material and developing the resist layer.

In other methods, the step of etching the second layer may be included to access the reflective material therethrough. The reflective material may include metal lines and the method may further comprise the step of forming interconnects through the second layer to electrically couple the interconnects to the metal lines. The reflective material may include tungsten or aluminum. The reflective material may also include Ti, Ta, TaN, TiN, Cu, WSi, Ti Si, CoSi or compounds formed therefrom. The radiation preferably includes ultraviolet radiation, and the step of providing radiation may include the step of providing ultraviolet radiation which is transmitted through the resist layer and the second layer and reflected from the reflective material. The ultraviolet radiation preferably has a wavelength between about 150 and about 350 nm. The step of providing radiation may also include providing radiation through a mask for shielding predetermined areas of the resist layer. The second layer preferably includes dielectric material. The step of depositing an anti-reflective material below the first layer on areas other than on the reflective material of the first layer to screen out reflections from underlying patterns may also be included. The anti-reflective material may include SiON. The resist layer may be a negative resist and the second layer may be a dielectric layer and the method may further comprise the step of forming a dielectric pillar from material from the second layer on the reflective material of the first layer.

A method of forming vertical interconnects for semiconductor devices includes the steps of providing a reflecting conductive layer having metal structures therein and a resist layer wherein a dielectric layer is disposed between the reflecting conductive layer and the resist layer, patterning the resist layer, forming holes in the dielectric layer in accordance with the resist pattern and depositing conductive material in the holes to interconnect structures to the deposited conductive material. The step of patterning the resist layer further includes the steps of radiating light through the resist layer and the dielectric layer, reflecting the light off of the structures to render the resist removable and developing the resist to open holes in the resist over the structures.

In alternate methods of forming vertical interconnects, the structures may include metal lines. The structures may include tungsten or aluminum. The reflective material may also include Ti, Ta, TaN, TiN, Cu, WSi, Ti Si, CoSi or compounds formed therefrom. The step of radiating may include the step of radiating ultraviolet light which is transmitted through the resist layer and the second layer and reflected from the reflective material. The ultraviolet light preferably has a wavelength between about 150 and about 350 nm. The step of radiating may include radiating light through a mask for shielding predetermined areas of the resist layer. The mask may include a pattern for radiating interconnect locations and may further include the step of exposing the resist layer to radiation through the mask.

In still other methods, the steps of forming a hard mask on the dielectric layer between the resist layer and the dielectric layer, radiating light through the resist layer, the hard mask and the dielectric layer, reflecting the light off of the structures to render the resist removable, developing the resist to open holes in the resist over the metal structures and forming holes in the hard mask in accordance with the resist pattern may also be included. The step of patterning the resist includes the steps of providing a mask having a pattern of metal lines thereon for radiating interconnect locations at crossover areas between the metal structures and the pattern of metal lines and exposing the resist layer to radiation through the mask to render the resist layer removable. The step of forming block outs at crossover areas where interconnects are not necessary may also be included. The step of depositing an anti-reflective material on areas other than the structures of the first layer may be included. The anti-reflective material may include SiON.

A semiconductor device in accordance with the invention includes a first layer with reflective structures therein. A second layer is formed on the first layer, and a patterned resist layer is formed on the second layer. Etched holes are formed in the second layer in accordance with the resist layer pattern, and interconnects are formed in the holes for electrically coupling to the reflective structures wherein the patterned resist layer is rendered by light transmitted through the resist layer and the second layer and reflected from the reflective structures thereby adequately exposing areas directly over the reflective structures, the exposed areas defining the interconnect locations such that the interconnects are aligned with the reflective structures when formed in the holes.

In alternate embodiments of the semiconductor device, the reflective structures may include metal lines. The reflective structures may include aluminum or tungsten. The second layer preferably includes a dielectric material and more preferably a silicon oxide. The light may include ultraviolet light. The patterned resist layer may be patterned using a photolithographic mask. The photolithographic mask may include a metal line pattern for a next higher level in the semiconductor device such that interconnects are defined at crossovers between mask pattern metal lines and the reflective structures of the first layer. A hard mask may be included between the resist layer and the second layer. The hard mask preferably transmits light therethrough. The hard mask may be further be partially covered by block outs for protecting areas of second layer where holes to reflective structures are not needed. An anti-reflective layer may be disposed on areas other than the reflective structures of the first layer. The anti-reflective layer may include SiON.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present disclosure relates to semiconductor devices and more particularly, to a self-aligned interconnect and method for forming the self-aligned interconnect for providing reduced layout area. The present invention uses reflective properties of underlying layers covered by a dielectric layer to adequately expose a resist layer to develop the resist for etching the dielectric layer. During conventional fabrication, radiation is directed through lithographic mask to a resist layer thereby causing the resist layer to develop in exposed areas (positive resist) or to develop in unexposed areas (negative resist). The conventional fabrication is performed blindly, that is, alignment between the resist pattern and an underlying layer are aligned using reference locations however the alignment is only achieved within error limits.

In the present invention, a transmitting mask layer is used to permit radiation to penetrate through the resist layer and the dielectric layer and be reflected back by highly reflective portions of the underlying layer. The reflected radiation is significant in the case of highly reflective portions, such as metalization regions, in the underlying layer. The resist layer is thereby exposed with a higher intensity and from both sides at regions over the underlying layer which include highly reflective materials. For a negative resist, the resist is rendered soluble for the developer over areas that are not highly reflective. For a positive resist, the resist is rendered soluble for the developer over areas that are highly reflective thereby providing locations for vias directly over underlying devices, for example, metal lines. A self-alignment method is realized by exploiting the correctly developed resist which permits, for example, a via to be formed directly over a metal line. In this way, landing pads may be reduced in size thereby permitting a reduction in chip dimensions.

Figure 1:
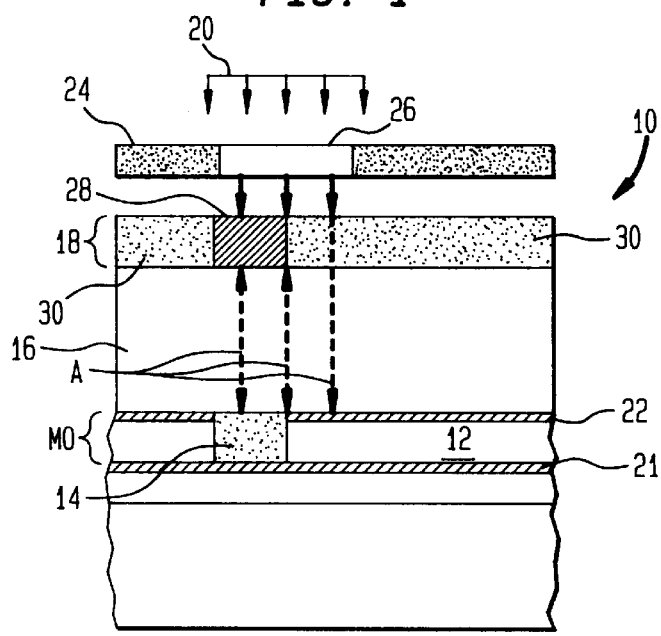
FIG. 1 is a cross-sectional view of a semiconductor device during exposure to light in accordance with the present invention.

Referring now in specific detail to the drawings in which like reference numerals identify similar or identical elements throughout the several views, FIG. 1 shows a semiconductor device 10 having a metal layer M0 formed in a dielectric layer 12. M0 includes conductive or metal lines 14. A layer 16 is formed on M0. Layer 16 includes a dielectric material, such as an oxide, preferably silicon dioxide. Layer 16 is transmissive for the radiation used to expose a resist layer 18, i.e. efficiently transmits radiation of a particular wavelength, for example between about 150 nm to about 350 nm, and preferably about 248 nm. Resist layer 18 includes materials known in the art which become chemically inert (positive resist) when exposed to ultraviolet light or chemically inert when protected from ultraviolet light. Preferred embodiments further include using silicon dioxide for layer 16 which transmits light having a wavelength between about 200 nm and about 700 nm with little absorption, for example less than about 0.1%. Metal layer M0 is preferably highly reflective for the wavelengths of incident light transmitted through layer 16. In one embodiment, the reflectivity is greater than about 90%, although reflectivities of 40% or greater are also contemplated. In one embodiment, M0 includes metal lines 14 comprised on tungsten (W) or aluminum (Al). Other reflective materials may also be used, for example Ti, Ta, TaN, TiN, Cu, WSi, Ti Si, CoSi or compounds formed therefrom.

The invention is described herein with reference to a positive resist which may be used to form interconnects, i.e. contacts or vias, in accordance with the present invention. The present invention extends to the use of negative resists which may be used to form pillars or plugs of dielectric material over conductors, for example, metal lines 104. Such pillars are preferably transparent and are formed using the reflective properties and negative resist pattern.

A radiation source 20 is provided for directing radiation onto a surface of resist layer 18. For example, ultraviolet light, preferably between about 150 nm and about 350 nm. A via mask 24 is provided to shield (or expose in the case of negative resist) resist layer 18 from light in predetermined areas consistent with the design of semiconductor device 10.

Via mask 24 includes windows 26 which are biased such that effectively exposed resist areas are larger than an intended diameter for via locations 28. For example, a 250 mn exposed area may be used for a 175 nm via diameter. Resist layer 18 functions as a mask for forming vias therethrough. Via locations 28 do not cure when exposed to light. Instead, locations 28 remain uncured and are removed (or opened up) by a developer. The biasing of via mask 24 permits some misalignment of mask 24 and metal line 14 (or other metal structures in M0) without resulting in a reduction of via diameter. The landing pad i.e. metal line 14, does not have to be any larger than the via diameter.

Light from source 20 is transmitted into resist layer 18. Light as shown by arrows "A" is transmitted through layer 16. Light over metal line 14 is reflected back and again is transmitted into resist layer 18 at location 28. Light not incident on metal line 14 is mostly absorbed in dielectric layer 12.

To further exploit the reflections from M0, a weak anti-reflective coating or layer 22 or no anti-reflective coating at all may be employed over areas of M0 where reflections are not desired. In a preferred embodiment an anti-reflective coating 21 is included prior to depositing M0 metal and dielectric layer 12. Anti-reflective coatings 21 and 22 may include SiON. In this way, reflections from areas without metal lines are suppressed for layers below M0.

By underexposing resist in areas 30 (underexposed resist) by suppressing reflections from the layers below, resist layer 18 is not opened by the develop process. By adequately exposing location 28 both directly and by reflection from underlying metal line 14 or other areas of metal in M0, resist layer 18 is opened up, when developed by the develop process, directly over metal line 14 thereby providing a via location directly communicating with metal line 14. In the alternative, a negative resist is used to leave a plug in the location directly over the metal line 14.

Figure 2:
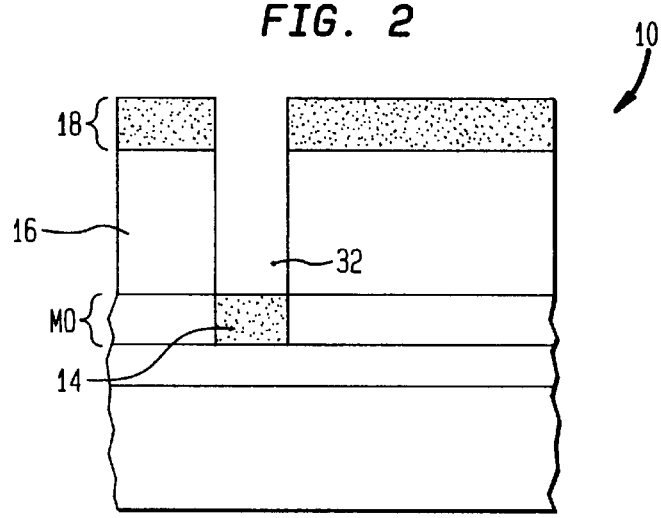
FIG. 2 is a cross-sectional view of the semiconductor device of FIG. 1 having interconnect or via holes opened in accordance with the present invention.
Figure 3:
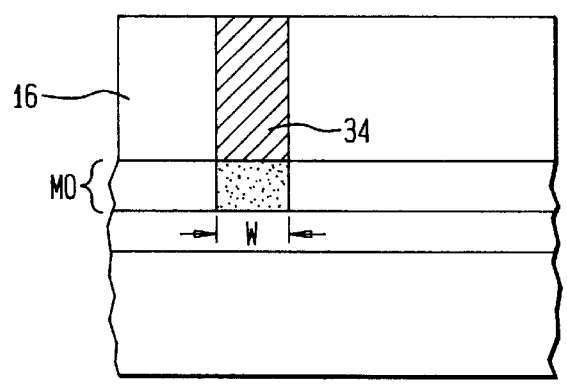
FIG. 3 is cross-sectional view of the semiconductor device of FIG. 2 having an interconnect or via formed in accordance with the present invention.

Referring to FIGS. 2 and 3, an opening 32 is formed in layer 16 by etching in accordance with resist layer 18 to provide a location for the deposition of a metal therein. The metal is deposited to connect to metal line 14. A via 34 is formed which is self-aligned relative to metal line 14. The expose conditions as described above ensure that the vias are only defined over existing metal structures. In accordance with the present invention, metal line 14 may be decreased in width, w, to assist in reducing the size of semiconductor device 10. Width, w, no longer must include a worst case tolerance dimension component. The structure in FIG. 3 has resist layer 18 removed and is further processed to include additional metal layers (not shown), i.e., M1, etc. which may include self-alignment in accordance with the present invention.

Figure 4:
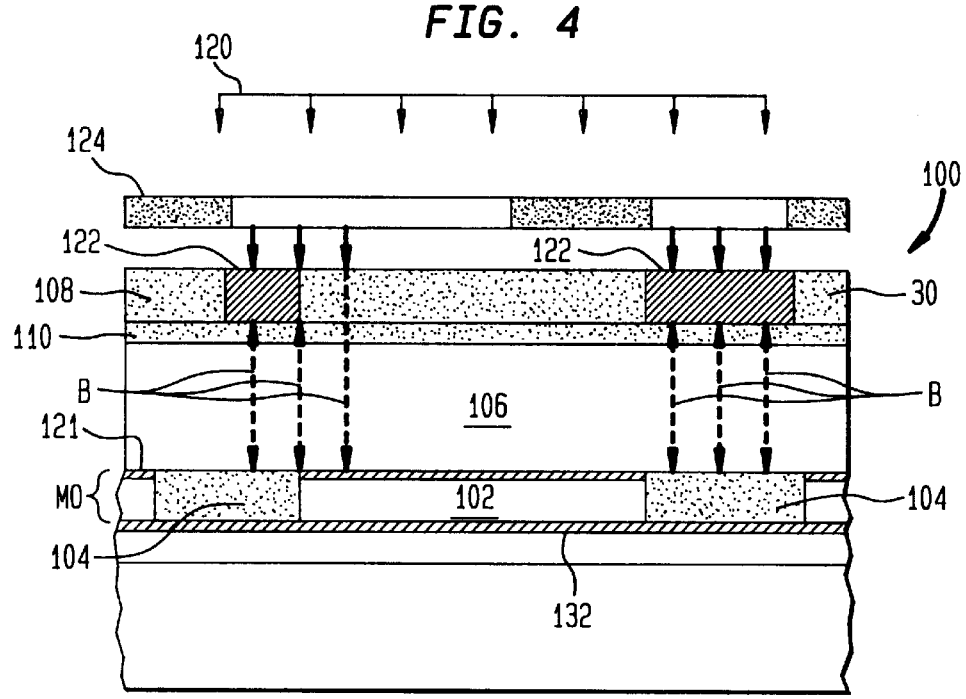
FIG. 4 is cross-sectional view of another semiconductor device during exposure to light in accordance with the present invention.

Referring to FIG. 4, a semiconductor device 100 is shown having a metal layer M0 formed in a dielectric layer 102. M0 includes a metal lines 104. A layer 106 is formed on M0. Layer 106 includes a dielectric material, such as an oxide, preferably silicon dioxide. A hard mask layer 110 is formed on layer 106. Hard mask layer may include SiN or SiON. Layer 106 and hard mask layer 110 transmit the radiation used to expose a resist layer 108, i.e. efficiently transmits radiation of a particular wavelength suitable for rendering resist layer to form a pattern, for example the wavelength is about 150 nm to about 350 nm. In a preferred embodiment, resist layer 108 (as described above) becomes chemically inert when exposed to ultraviolet light (positive resist, see description above for a negative resist). Preferred embodiments further include using silicon dioxide for layer 106 which transmits light having a wavelength between about 200 nm and about 700 nm with little absorption, for example less than about 0.1%. Metal layer M0 is preferably highly reflective for the wavelengths of incident light transmitted through layer 106. In one embodiment, the reflectivity is greater than about 90%, although reflectivities greater than 40% are also contemplated. In one embodiment, M0 includes metal lines 104 comprised on tungsten (W) or aluminum (Al). Other reflective materials may also be used, as described above.

A radiation source 120 is provided for directing radiation onto a surface of resist layer 108. For example, ultraviolet light, preferably between about 150 nm and about 350 nm. An M1 mask 124 is provided to shield resist layer 108 from light in predetermined areas consistent with the design of semiconductor device 100. M1 mask 124 is provided to form a pattern for M1 layer metal lines.

By introducing mask 124 (having the M1 metal lines pattern) over M0, radiation, indicated by arrows "B", incident through mask 124 is transmitted through resist layer 108, hard mask 110 and layer 106. Radiation is reflected back form M0 metal lines 104 to correctly expose resist layer 108 in areas 122 as described above. Areas 122 occur in regions where M1 metal lines cross over M0 metal lines. By exploiting the reflections from M0 metal lines 104, a self-aligned process is realized wherein resist layer 108 is opened, after a develop process, in areas 122.

To further exploit the reflections from M0, a weak anti-reflective coating 121 or no anti-reflective coating at all may be employed over areas of M0 where reflections are not desired. In a preferred embodiment an anti-reflective coating 132 is included prior to depositing M0 metal and dielectric layer 102. Anti-reflective coating 132 may include SiON. In this way, reflections from areas without metal lines are suppressed for layers below M0.

Figure 5:
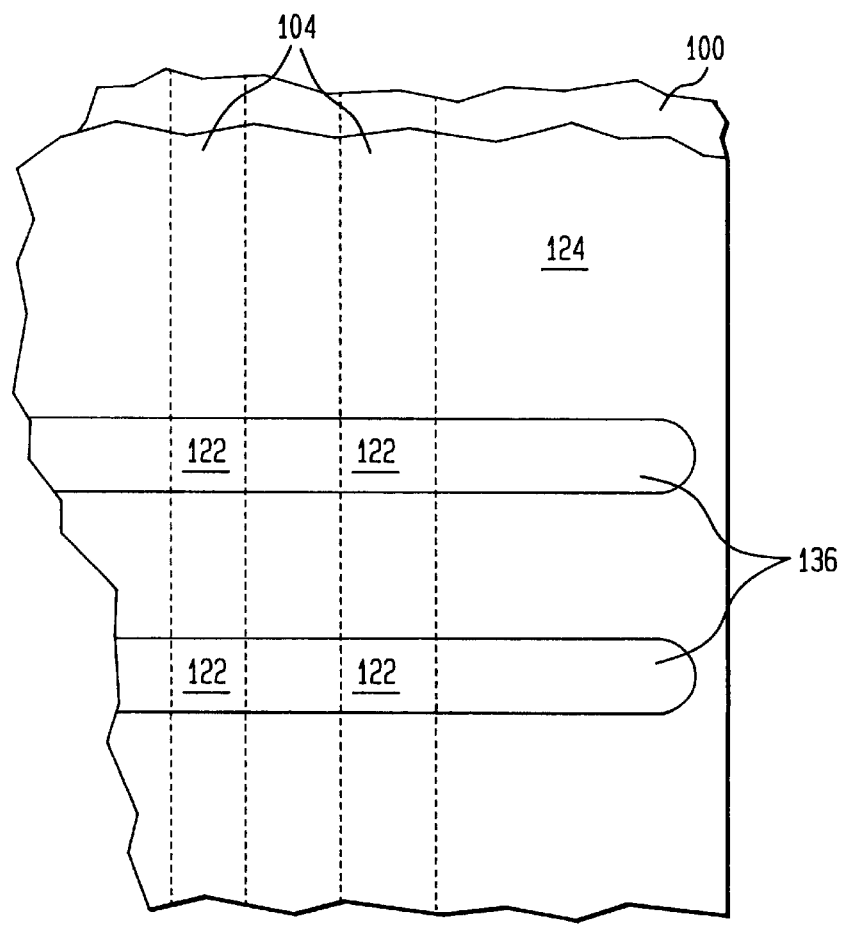
FIG. 5 is top view of an M1 mask over the semiconductor chip of FIG. 4 showing crossovers between M1 lines in the mask and metal lines in M0 in accordance with the present invention.

Referring to FIG. 5, an illustrative example showing crossovers locations is shown. M1 mask 124 is disposed over semiconductor device 100. Metal lines 104 are shown in phantom (dashed) lines since they remain buried below layers 106 and 108. M1 pattern lines 136 are shown on M1 mask 124. Lines 136 and metal lines 104 crossover at areas 122. Areas 122 are the sites for interconnects or vias.

Figure 6:
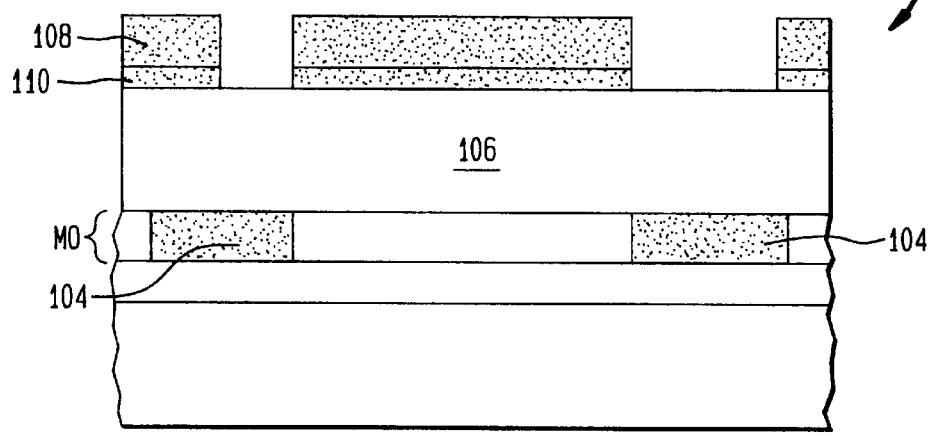
FIG. 6 is cross-sectional view of the semiconductor chip of FIG. 4 having a hard mask opened in accordance with the present invention.

Referring to FIG. 6, the pattern for resist layer 108 given by M0 and M1 cross overs is transferred to hard mask layer 110 by an etching process, for example reactive ion etching.

Figure 7:
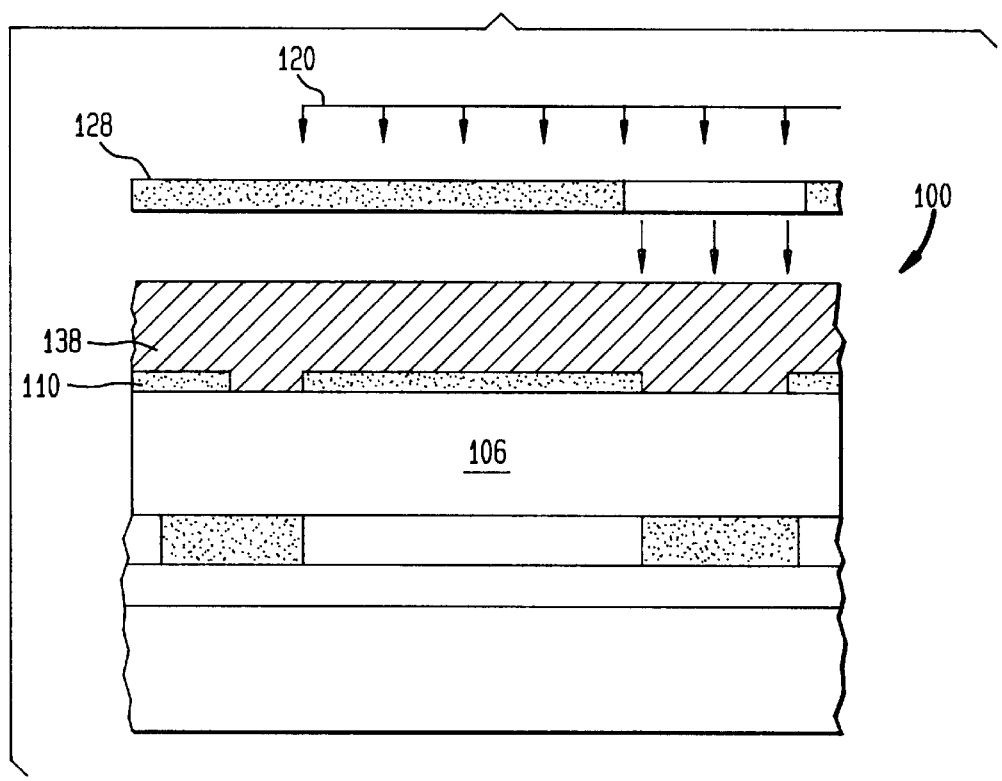
FIG. 7 is a cross-sectional view of the semiconductor device of FIG. 6, in accordance with the present invention, having an additional resist layer deposited and patterned to form blockouts to close off holes in the hard mask not intended to be interconnects or vias.
Figure 8:
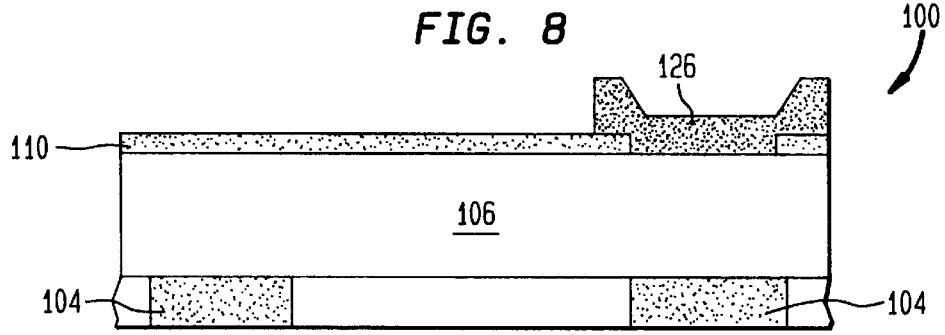
FIG. 8 is cross-sectional view of the semiconductor device of FIG. 7 having blockouts formed in accordance with the present invention.

Referring to FIGS. 7 and 8, generally, not all of the cross overs between M0 and M1 need to be connected by vias. As a result an additional lithographic step may be included. The additional lithographic step includes providing a resist layer 138 to form block outs 126 over layer 106 to fill in portions of hard mask layer 110 which are not to be vertical interconnect points. Block outs 126 are comprised of a resist material which is deposited on semiconductor device 100. A mask 128 may be computer generated having locations determined where block outs 126 are to be formed. For example, given a design layout with layer M0, vertical interconnects and an M1 layer (and appropriate ground rules), mask 128 may be generated. Mask 128 is uncritical since its smallest dimension is the separation between vias which is much larger than critical mask dimensions. This means the sizes of windows on mask 128 may be spaced with a less accuracy making processing easier. Resist layer 138 is removed leaving blockouts 126 in hard mask 110.

Figure 9:
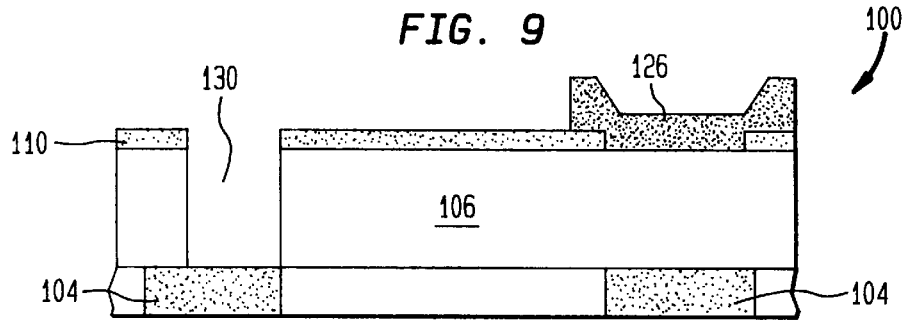
FIG. 9 is a cross-sectional view of the semiconductor device of FIG. 8 having interconnect or via holes opened in accordance with the present invention.
Figure 10:
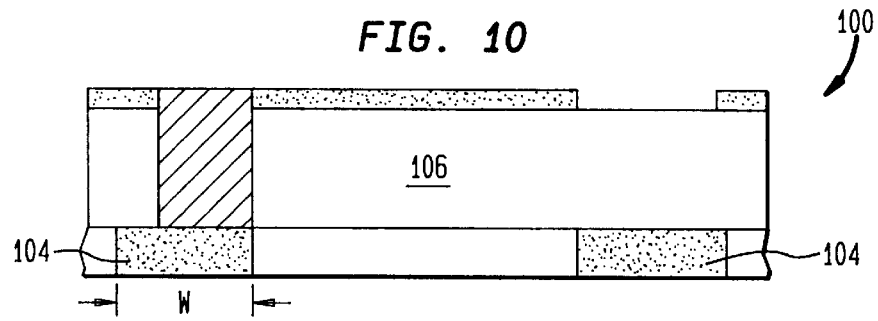
FIG. 10 is cross-sectional view of the semiconductor device of FIG. 9 having an interconnect or via formed in accordance with the present invention.

Referring to FIGS. 9 and 10, openings 130 for vias are formed in layer 106 by an etching process in accordance with openings in hard mask layer 110 to provide a location for the deposition of a metal therein. The metal is deposited to connect to metal line 104. A via 134 is formed which is self-aligned relative to metal line 104. The expose conditions as described above ensure that the vias are only defined over existing metal structures. In accordance with the present invention, metal line 104 may be decreased in width, w, to assist in reducing the size of semiconductor device 100. Width, w, no longer must include a worst case tolerance dimension component as described above. FIG. 10 has been further processed to remove hard mask layer 110 and block out 126. The structure in FIG. 10 is further processed to include additional metal layers and/or dielectric layers (not shown) which may include self-alignment in accordance with the present invention. Using a damascene approach, M1 lines are patterned as trenches in dielectric material and subsequently filled with metal. With a negative resist process, mask 124 can be used to form metal lines on M1 on top of vias 134. Mask 124 can also be used to form metal lines on M1 using a metal etch process with positive resist.

By employing the method described with reference to FIGS. 4–10, a critical mask (mask 24) is replaced by an uncritical mask (mask 124) at the expense of including an additional uncritical lithographic step (block outs 126 using mask 128). The method is completely self-aligned and provides for greater reliability in manufacturing semiconductor devices.

Figure 11:
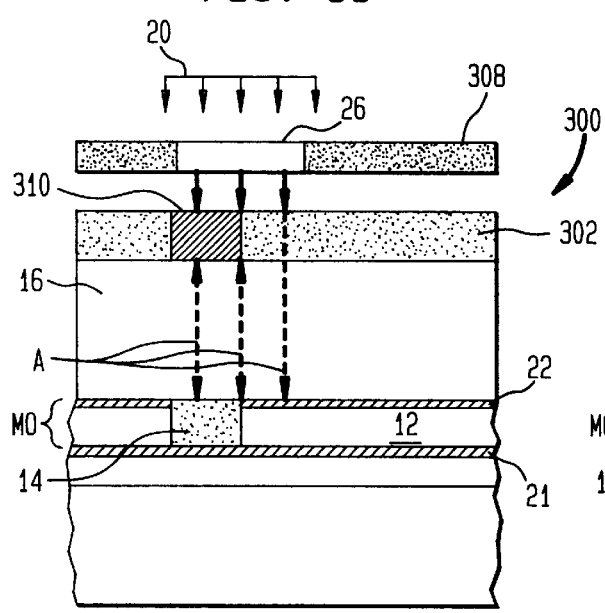
FIG. 11 is a cross-sectional view of another embodiment of a semiconductor device showing a negative resist for forming dielectric pillars in accordance with the present invention.
Figure 12:
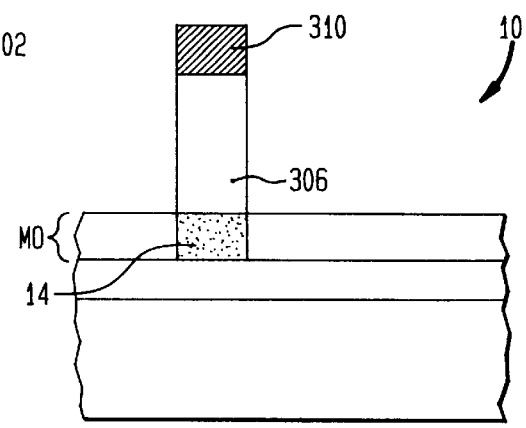
FIG. 12 is a cross-sectional view of the semiconductor device of FIG. 11 showing dielectric pillars formed in accordance with the present invention.

Referring to FIGS. 11 and 12, a semiconductor chip 300 is shown having dielectric pillar or plugs 306 formed over metal lines 14. A negative resist layer 302 is used to protect dielectric pillars 306 during etching. Light irradiates resist layer 302 through a mask 308. Resist layer 302 is irradiated at a greater rate than surrounding areas due to reflections (arrows "A") from metal line 14 thereby leaving a portion 310 of resist layer behind. Portion 310 protects dielectric layer 16. An etching process is performed to remove unprotected areas of layer 16 thereby leaving pillars 306 in place over metal line 14.

Having described preferred embodiments for a self aligned interconnect and method for reducing layout area (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming self-aligned features for semiconductor devices comprising the steps of:

providing a first layer including a reflective material on a surface of the first layer, a second layer formed on the first layer, and a resist layer formed on the second layer;

providing radiation through the resist layer and the second layer wherein the radiation is reflected from the reflective material back to the resist layer thereby increasing irradiation of the resist layer over the reflective material such that a sum of the radiation through the resist layer and the reflected radiation provides sufficient exposure time for the resist over the reflective material; and developing the resist layer to open holes in the resist layer in areas of the resist layer which have been irradiated by the reflected radiation.

2. The method as recited in claim 1, further comprising the step of etching the second layer to access the reflective material.

3. The method as recited in claim 2, wherein the reflective material includes metal lines and further comprising the step of forming interconnects through the second layer to electrically couple the interconnects to the metal lines.

4. The method as recited in claim 1, wherein the reflective material includes tungsten.

5. The method as recited in claim 1, wherein the reflective material includes aluminum.

6. The method as recited in claim 1, wherein the radiation includes ultraviolet radiation and the step of providing radiation includes the step of providing ultraviolet radiation which is transmitted through the resist layer and the second layer and reflected from the reflective material.

7. The method as recited in claim 6, wherein the ultraviolet radiation has a wavelength between about 150 nm and about 350 nm.

8. The method as recited in claim 1, wherein the step of providing radiation includes providing radiation through a mask for shielding areas of the resist layer.

9. The method as recited in claim 1, wherein the second layer includes dielectric material.

10. The method as recited in claim 1, further comprises the step of depositing an anti-reflective material on areas other than the reflective material of the first layer.

11. The method as recited in claim 10, wherein the anti-reflective material includes SiON.

12. The method as recited in claim 1, wherein the resist layer is a negative resist and the second layer is a dielectric layer and further comprising the step of forming a dielectric pillar on the reflective material of the first layer.

13. A method of forming vertical interconnects for semiconductor devices comprising the steps of:

providing a reflecting conductive layer having reflecting structures therein and a resist layer wherein a dielectric layer is disposed between the reflecting conductive layer and the resist layer;

patterning the resist layer;

forming holes in the dielectric layer in accordance with the resist pattern; and depositing conductive material in the holes to interconnect the reflecting structures to the deposited conductive material;

wherein the step of patterning the resist layer further comprises the steps of:

radiating light through the resist layer and the dielectric layer;

reflecting the light off of the reflecting structures such that a sum of the radiation through the resist layer and the reflected radiation provides sufficient exposure time to render the resist removable; and developing the resist to open holes in the resist over the reflecting structures.

14. The method as recited in claim 13, wherein the structures include metal lines.

15. The method as recited in claim 13, wherein the structures include tungsten.

16. The method as recited in claim 13, wherein the structures include aluminum.

17. The method as recited in claim 13, wherein the step of radiating includes the step of radiating ultraviolet light which is transmitted through the resist layer and the second layer and reflected from the structures.

18. The method as recited in claim 17, wherein the ultraviolet light has a wavelength between about 150 nm and about 350 nm.

19. The method as recited in claim 13, wherein the step of radiating includes radiating light through a mask for shielding areas of the resist layer.

20. The method as recited in claim 19, wherein the mask includes a pattern for radiating interconnect locations and further comprises the step of exposing the resist layer to radiation through the mask.

21. The method as recited in claim 13, further comprising the steps of:

forming a hard mask on the dielectric layer between the resist layer and the dielectric layer;

radiating light through the resist layer, the hard mask and the dielectric layer;

reflecting the light off of the structures to render the resist removable;

developing the resist to open holes in the resist over the structures; and forming holes in the hard mask in accordance with the resist pattern.

22. The method as recited in claim 13, wherein the step of patterning the resist comprises the steps of:

providing a mask having a pattern of metal lines thereon for radiating interconnect locations at crossover areas between the structures and the pattern of metal lines; and exposing the resist layer to radiation through the mask to render the resist layer removable.

23. The method as recited in claim 22, further comprising the step of forming block outs at crossover areas where interconnects are not necessary.

24. The method as recited in claim 13, further comprising the step of depositing an anti-reflective material on areas other than the structures of the first layer.

25. The method as recited in claim 24, wherein the anti-reflective material includes SiON.

26. The method as recited in claim 1, further comprising the steps of:

forming an anti-reflective layer over the first layer; and patterning the anti-reflective layer to remove the anti-reflective layer from selected areas of the reflective material.

27. The method as recited in claim 13, further comprising the steps of:

forming an anti-reflective layer over the reflecting conductive layer; and patterning the anti-reflective layer to remove the anti-reflective layer from the reflective structures.

* * * * *